(12) United States Patent
Baier et al.

(10) Patent No.: US 6,919,781 B2
(45) Date of Patent: Jul. 19, 2005

(54) SURFACE WAVE FILTER COMPRISING REACTANCE ELEMENTS

(75) Inventors: Thomas Baier, München (DE); Michael Unterberger, Unterhaching (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 10/204,283

(22) PCT Filed: Feb. 2, 2001

(86) PCT No.: PCT/DE01/00406

§ 371 (c)(1), (2), (4) Date: Nov. 18, 2002

(87) PCT Pub. No.: WO01/61859

PCT Pub. Date: Aug. 23, 2001

(65) Prior Publication Data

US 2003/0174029 A1 Sep. 18, 2003

(30) Foreign Application Priority Data

Feb. 17, 2000 (DE) .......................... 100 07 178

(51) Int. Cl.[7] .............................. H03H 9/64
(52) U.S. Cl. ...................... 333/195; 333/196
(58) Field of Search ................ 333/193–196, 333/133

(56) References Cited

U.S. PATENT DOCUMENTS

| | | | |
|---|---|---|---|
| 4,785,270 A | 11/1988 | Kinsman | 333/193 |
| 4,906,885 A | 3/1990 | Kojima et al. | 310/313 B |
| 5,144,185 A * | 9/1992 | Yuhara et al. | 310/313 |
| 5,363,073 A | 11/1994 | Higgins | 333/195 |
| 5,499,003 A * | 3/1996 | Davenport | 333/195 |
| 5,508,667 A * | 4/1996 | Kondratiev et al. | 333/194 |
| 5,610,566 A * | 3/1997 | Chen et al. | 333/194 |
| 6,081,172 A * | 6/2000 | Strauss et al. | 333/193 |
| 6,339,704 B1 * | 1/2002 | Furukawa | 455/313 |
| 6,353,372 B1 * | 3/2002 | Baier et al. | 333/195 |
| 6,420,946 B1 * | 7/2002 | Bauer et al. | 333/193 |

FOREIGN PATENT DOCUMENTS

| | | | | |
|---|---|---|---|---|
| DE | 19724259 | | 12/1998 | |
| DE | 198 18 038 A1 | | 4/1999 | |
| EP | 0605884 | | 7/1994 | |
| EP | 0 940 915 A2 | | 8/1999 | |
| JP | 63-183309 | * | 11/1988 | 333/195 |
| JP | 2001-7681 | * | 1/2001 | |
| WO | WO 97/45955 | | 4/1997 | |
| WO | WO 98/12809 | * | 3/1998 | |

* cited by examiner

*Primary Examiner*—Barbara Summons
(74) *Attorney, Agent, or Firm*—Fish & Richardson P.C.

(57) ABSTRACT

Proposed is a SAW HF filter with reactance elements, which is particularly suitable for mobile radio. The filter is balanced on both sides, is electrically symmetric, and comprises a four-pole reactance series element, which can be formed from two two-pole pole reactance elements or from a four-pole reactance element, and a resonator. One bar of the respective reactance elements is connected to the input side of the filter, while the other bar is connected to the output side of the filter.

16 Claims, 6 Drawing Sheets

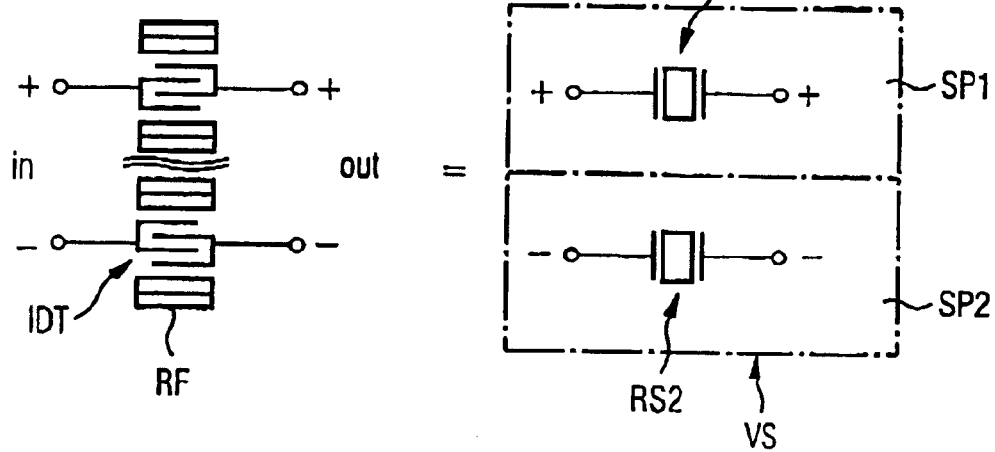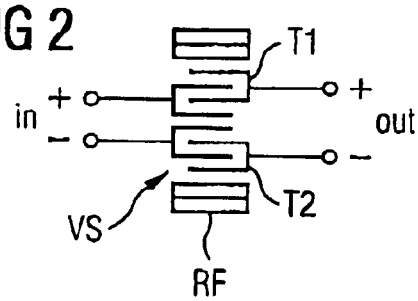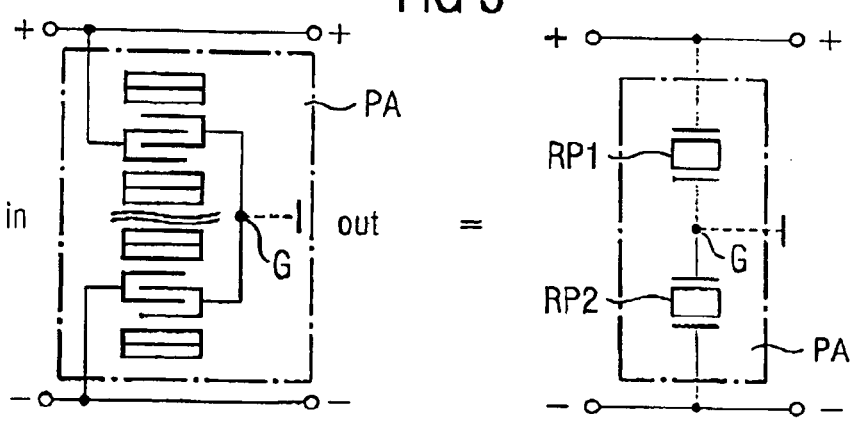

SURFACE WAVE FILTER COMPRISING REACTANCE ELEMENTS

CROSS-REFERENCE TO RELATED APPLICATIONS

This application claims priority to PCT Application No. PCT/DE01/00406, filed on Feb. 2, 2001, and to German Patent Application No. 100 07 178.3, filed on Feb. 17, 2000.

BACKGROUND

Surface acoustic wave (SAW) filters are used predominantly in GSM mobile telephones. SAW filters are operated single-ended on an input side and balanced on an output side. Single-ended means that a signal is applied to only one of two connectors, while the other connector is grounded. This method of connection is also referred to as asymmetric. An input or output of a SAW filter that is operated in a balanced mode, on the other hand, has two connectors whose signals are ideally phase-shifted by 180° relative to one another. This means that a signal that is equal in magnitude can be obtained at both connectors, and that the signal differs merely in its prefix. Such symmetric/asymmetric operation is also referred to as a BALUN function.

For more modern mobile radio systems, such as EDGE, UMTS and CDMA, the market is increasingly demanding SAW filters that can be operated in balanced mode on both sides. Such filters are already being installed in numerous established mobile radio systems under AMPS, PCS, and PDC 1.5.

Another critical factor for the mode of operation of a SAW filter is the filter's impedance. Until recently, a filter impedance of 50 ohm on the input side and the output side was consistently being demanded and offered, while now, higher impedance values in the range of 100 to 400 ohm are increasingly required for balanced-balanced filters.

A SAW HF (high frequency) filter must also satisfy stringent requirements with regard to selection and insertion attenuation, particularly in the realm of mobile communication. These requirements can only be met with special, novel filter structures.

Known filters that can be operated in balanced mode on both sides are known, for example, from EP-A-0 605 884. These filters are implemented using longitudinal mode resonator filters (=dual mode SAW=DMS filters) on lithium niobate or lithium tantalate. In these filters, an odd number of interdigital transducers is disposed between two reflectors for each track. A balanced-balanced filter is structured, for example, as a two-track filter, in which two tracks with three transducers are respectively connected in cascade via the center transducer. The two outer transducers of a track are respectively connected to the input or output, and demonstrate a phase inversion, which permits symmetric operation at each input or output. Such a filter possesses the same impedance on the input and the output sides.

SUMMARY

It is the object of the present invention to provide filters that can be operated in balanced mode on both sides, and that demonstrate a high level of selection and a low insertion attenuation.

According to the invention, this object is accomplished by a surface acoustic wave filter according to claim 1. Advantageous further developments of the invention ensue from the dependent claims.

The invention proposes, for the first time, to structure an HF filter that can be operated in balanced mode on both sides with reactance elements on a SAW basis. A reactance element on a SAW basis can be embodied as a SAW resonator. However, the general definition of a reactance element is that it does not act as a filter in and of itself, but rather only by way of its impedance, which can therefore also be replaced by any desired impedance element. The filter according to the invention is embodied to be completely electrically symmetric. It has at least one four-pole reactance element, with two poles (=connectors) forming the symmetric input and output, respectively. A four-pole reactance element can be formed by two individual, geometrically identical two-pole reactance elements, or by a single (four-pole) reactance element with four connectors (poles). The term reactance element is understood to mean a SAW reactance element that has at least one interdigital transducer, one of whose current bars is connected to the input side, while its other current bar is connected to the output side, thereby producing a signal connection (=path) between the input side and the output side, in which the reactance element is embedded.

A four-pole reactance element according to the invention represents a basic structure for a rudimentary SAW HF filter that accomplishes the stated object in a simple manner. Previous reactance filters have an asymmetric structure and possess only one signal-conducting connector on both sides, in other words, a single-ended connector, while the other connector is grounded. This type of known reactance filter therefore possesses only a signal path that connects the two signal-conducting connectors with one another on the input and output sides. The connection to ground is made via resonators, i.e., reactance elements connected in parallel to this. The entire arrangement of known reactance filters is therefore both electrically and geometrically asymmetric.

In the simplest embodiment, two resonators are provided, which together form a reactance element. One connector of each of the resonators is connected to the input side; the other is connected to the output side via the other current bar. The resonators are not coupled acoustically.

In a further embodiment of the invention, the two signal paths that each have a reactance element, i.e., a resonator, can be symmetrically connected to one another via at least one parallel branch, thereby producing a high-quality HF filter. In the simplest case, this can be a SAW resonator connected in parallel.

It is also possible, however, to connect the inputs or outputs of the four-pole reactance element to the symmetric input of a DMS filter that is symmetric on both sides. The outputs of the DMS filter then represent the output and input, respectively, of a high-quality filter in accordance with the invention.

In a further embodiment of the invention, a parallel branch is also provided between the two signal paths, in which branch two reactance elements, i.e., resonators, connected in series are disposed, the elements not being acoustically coupled. A resonator having a current bar that has been divided into two axially symmetric parts can also be provided as the parallel reactance element; the two parts are each connected to the two connectors of the interdigital transducer. The opposite current bar of the interdigital transducer divided in this way represents a virtual ground point that can also be connected to a ground connector, if necessary.

A single four-pole reactance series element is also obtained if the interdigital transducer of a surface acoustic wave resonator is symmetrically divided into two partial transducers having two connectors each. On both sides of the acoustic track of the resonator, symmetric inputs and outputs are then formed, which represent the inputs and outputs of a basic structure of an HF filter that is fully functional with further symmetric SAW components.

In a further embodiment of the invention, the four-pole reactance element can be connected symmetrically with other reactance elements or also in cascade with other DMS filters. Thus, a DMS filter connected in cascade with the reactance element can be arranged in cascade with another symmetric DMS filter. It is also possible to connect two symmetric DMS filters to one another via the four-pole reactance element that is connected between them. Each of the DMS filters can again be cascaded; in other words, it can have several acoustic tracks connected in cascade.

In another embodiment of the invention, two four-pole reactance elements are connected to one another crosswise, in the form of a bridge circuit. The two connectors of the symmetric input of the first four-pole reactance element are connected to one connector of the input and the output of the second four-pole reactance element, respectively. The two connectors of the output of the first reactance element are respectively connected to the other connector of the input and the output of the second reactance element. This is a variation of the invention that does not have a geometrically symmetric arrangement, but merely an electrically symmetric arrangement.

A reactance filter according to the invention can also include a DMS track or a resonator in which two surface acoustic wave structures that are disposed adjacent to one another and are selected independently of one another from an interdigital transducer and a reflector are phase-shifted relative to one another. The transition between the two phase-shifted surface acoustic wave structures is formed by a continuously varied finger period and continuously varied finger distances, or only by a continuously varied finger period. The finger period exhibits a minimum in the region of the transition and continuously decreasing from both sides. This avoids leakage losses in the HF filter.

In a further embodiment of the invention, individual or groups of interdigital transducers of reactance elements, or DMS filters or DMS tracks connected with them, can be weighted in order to adapt various parameters of the entire filter. For example, the bandwidth of the filter can be varied in this way, the impedance of the filter can be changed, or the selection can be increased. Such weighting can be performed as omission weighting or overlap weighting. Other examples of weighted interdigital transducers that can all be used in filters according to the invention can be found, for example, in DE-A-19724259 (=97P1705), which is hereby incorporated by reference in its entirety.

It is also possible, however, to implement cascade weighting in an interdigital transducer. For this purpose, part of the interdigital transducer is replaced by two or more partial transducers connected in series, each having a reduced track width. Signal switching of the partial transducers can be achieved by incorporating an additional current bar into a conventional interdigital transducer. It is also possible that an internal current bar does not extend over the entire length of the interdigital transducer. The result is an interdigital transducer that is divided into several partial transducers connected in parallel, with one of these partial transducers being divided in turn into two or more partial transducers connected in series. In this way, the impedance of the interdigital transducer, and therefore that of the input or output or the reactance element or the filter, can be increased in a simple manner.

Preferably, a filter according to the invention is constructed on a single substrate, with lithium tantalate and lithium niobate being the preferred materials.

Electrode structures comprising aluminum, an aluminum/copper alloy, aluminum and copper layers, an aluminum/magnesium alloy, or aluminum and magnesium layers are suitable for the use as metal on these substrate materials. These materials are distinguished by good adhesion to the substrate material, for example. A SAW HF filter according to the invention is also highly geometrically symmetric, with the exception of the bridge circuit, when implemented on the piezoelectric substrate. Consequently, the electrical connectors (poles) are also arranged symmetrically on the substrate. If the filter according to the invention is mounted to a base plate using flip-chip technology, in which the substrate is connected to metal that faces the base plate by way of solder beads or bumps, this produces filters that have particularly compact external dimensions.

The invention will be explained in greater detail below by way of exemplary embodiments and the associated 16 figures.

DESCRIPTION OF THE DRAWINGS

FIG. 1 shows a four-pole reactance element comprising two reactance elements.

FIG. 2 shows a reactance element configured as a four-pole reactance element.

FIG. 3 shows two symmetric resonators connected in series in the parallel branch.

DETAILED DESCRIPTION

Figure 4:
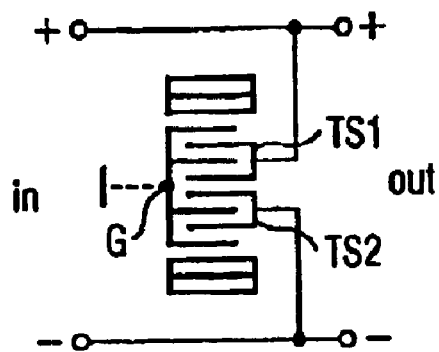
FIG. 4 shows a symmetric parallel branch with a reactance element.

FIG. 1 illustrates a simple embodiment of the invention, in which the four-pole reactance element is formed by two geometrically identical reactance elements RS configured as resonators. Two two-pole reactance elements RS1, RS2 each have a connector (pole), which connectors together form the input IN, while the two other connectors form the output OUT. Each reactance element comprises an interdigital transducer IDT, which is disposed between two reflectors RF. The first reactance element RS1 forms the first signal path SP1 and the second reactance element RS2 forms the second signal path SP2, as shown in simplified form in the right part of FIG. 1. The two reactance elements RS are not acoustically coupled to each other, as illustrated in the left part of the drawing by the double wave line.

FIG. 2 shows a four-pole reactance element that is embodied as a reactance element (resonator) having four connectors. In this resonator, the central interdigital transducer is symmetrically divided in the center into a first partial transducer T1 and a second partial transducer T2, each of which has two connectors. In this case, two connectors located on one side are combined to form the input IN or the output OUT, respectively. Such a four-pole reactance element represents a rudimentary SAW filter. Because of the reciprocity of SAW components, it is clear for this and all other filters according to the invention that they can also be operated in the opposite direction, that is, in a mode of operation in which the inputs and outputs IN, OUT are reversed. This also holds true for the arrangement of the partial structures described below, which can be connected in cascade with such a reactance element.

FIG. 3 shows a parallel branch PA, which can be connected between the IN and OUT connectors on the input or output side of the reactance element. Two reactance elements RP are connected in series in the parallel branch. A virtual ground point G exists between the two reactance elements RP, which demonstrates a constant electrical potential because of its symmetric central position between the signal paths, and can optionally also be connected to ground.

FIG. 4 shows a reactance element with a different structure, which is likewise arranged in a parallel branch and can be connected between the two connectors of the input or the output of a reactance element. This reactance element has an interdigital transducer that is disposed between two reflectors and has a current bar that is symmetrically divided into two partial bars TS1, TS2 (shown on the right in the figure). As a result, the interdigital transducer is divided into two partial transducers that are connected in series and together represent a reactance element for the parallel branch, and can be connected to one of the reactance elements shown in FIGS. 1 or 2.

Figure 5:
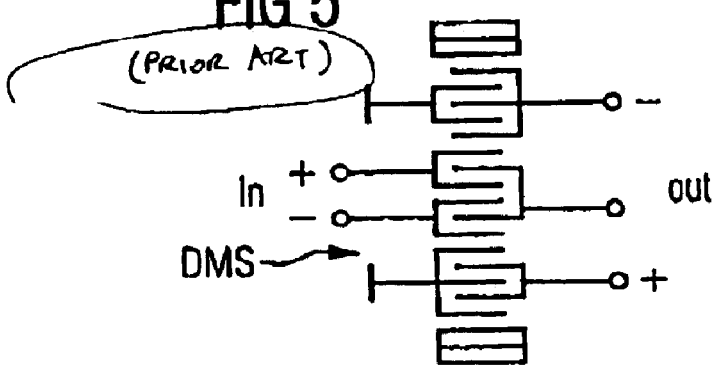
FIG. 5 shows a symmetric DMS filter structure.

FIG. 5 shows a known DMS filter, which can function on its own, and has symmetric connectors on the input and output sides. The center interdigital transducer of the three interdigital transducers is provided with two IN connectors on one side of the acoustic track through the symmetric division of one current bar. These connectors form the symmetric input IN. The two outer interdigital transducers are connected to the output OUT. Such a symmetric DMS filter can now be connected to the input or the output of a reactance element, similar to a reactance element in the parallel branch, as an additional partial structure (see FIG. 1 or 2), or, to state it differently, it can be connected in cascade with this element. It is also possible to switch a DMS filter in cascade with a reactance element that has a reactance element in the parallel branch.

Figure 6:
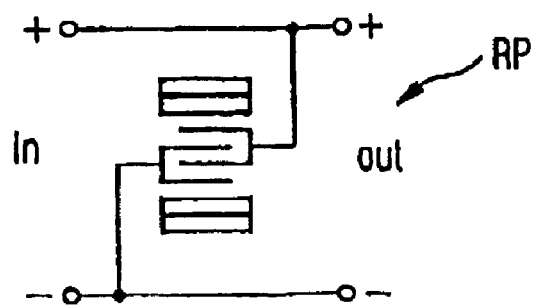
FIG. 6 shows a reactance element in the symmetric parallel branch.

FIG. 6 shows another possible partial structure that can be connected to a reactance element according to the invention. Here, a simple SAW resonator is disposed in a parallel branch as a parallel reactance element RP.

Figure 7:
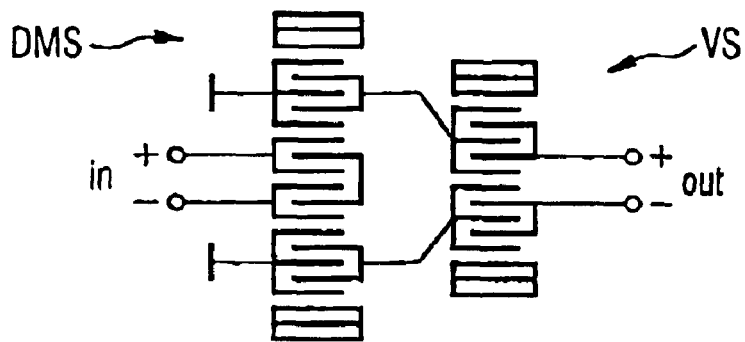
FIG. 7 shows a symmetric reactance element in cascade with a symmetric DMS filter.

FIG. 7 shows a further embodiment of the invention, in which a four-pole reactance element VS is connected in cascade with a symmetric DMS filter DMS (see FIG. 5, for example). The output formed via the outer interdigital transducers of the DMS filter DMS is connected to the two connectors of the input of the reactance element.

Figure 8:
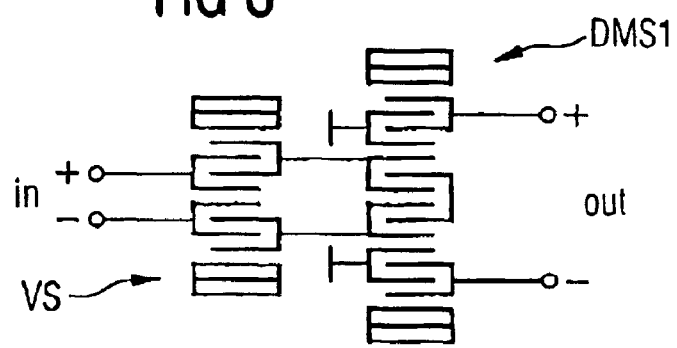
FIG. 8 shows a symmetric DMS filter in cascade with a symmetric reactance element.
Figure 9:
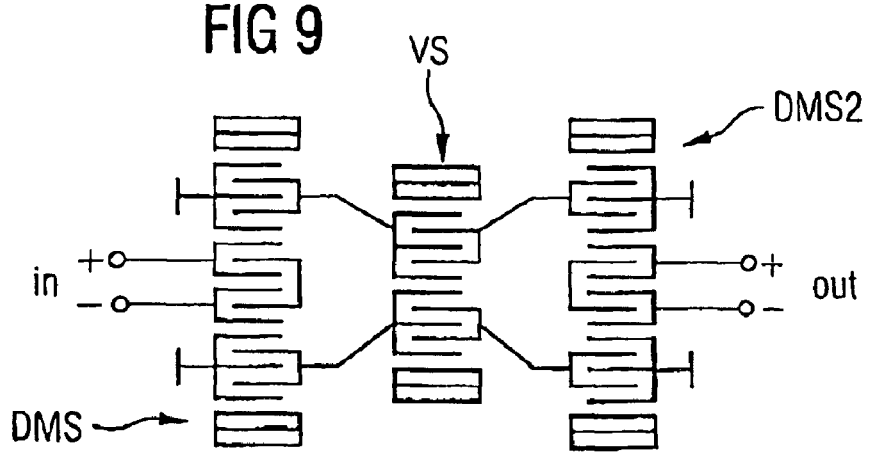
FIG. 9 shows a symmetric reactance element connected between two symmetric DMS filters.

FIG. 8 shows a switching layout similar to that in FIG. 7, but here, the symmetric DMS filter DMS is connected to the reactance element VS via the two connectors of the center interdigital transducer. FIG. 9 shows a reactance element VS that is connected in cascade with a respective symmetric DMS filter DMS1, DMS2 on both sides. In the illustrated embodiment, the DMS filters are each connected to the reactance elements via the outer interdigital transducers. It is also possible, however, to create the connection between the DMS filter and the reactance element via the two connectors of the center interdigital transducer of the DMS filters.

Figure 10:
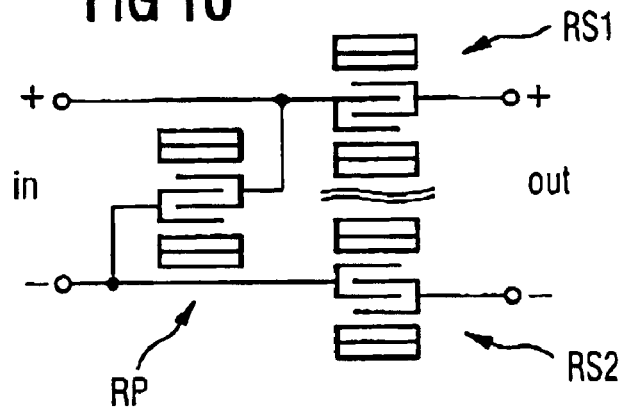
FIG. 10 shows two signal reactance elements with a reactance element connected in parallel, so that the elements form a symmetric reactance filter.

FIG. 10 shows a filter according to the invention, in which two signal paths are provided, with a two-pole reactance element RS1, RS2 (resonator) being disposed in each path. The two signal paths are bridged with a further two-pole reactance element, i.e., with a two-pole resonator, which is disposed in the parallel branch. In this instance, the resonator (RP) in the parallel branch is unbalanced in frequency relative to the resonators (RS1, RS2) in the signal paths, so the resonance frequencies of the resonators (RS1, RS2) in the signal paths are greater than or equal to the anti-resonance frequency of the resonator (RP) in the parallel branch (PA).

Figure 11:
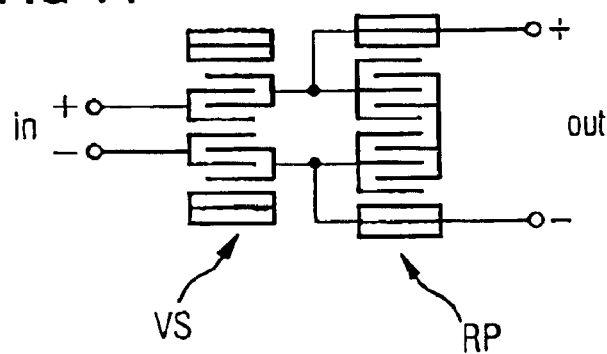
FIG. 11 shows a four-pole symmetric reactance element, with a two-pole reactance element being connected in parallel thereto, forming a symmetric reactance filter.

FIG. 11 shows a reactance element VS in which the two connectors of the output OUT are connected in parallel with a two-pole reactance element RP. This reactance element of the parallel branch corresponds to the reactance element shown in FIG. 4; namely, it has a divided current bar at the interdigital transducer. In an advantageous embodiment of this filter, the electrical connectors for the output OUT are connected to the reflectors of the reactance element in the parallel branch, and these are connected to the outputs of the reactance element VS. In this manner, the electrically inactive reflectors, which likewise comprise metallic structures, can be used as tracks. This eliminates the need for additional tracks on the surface of the chip on which the filter is constructed.

Figure 12:
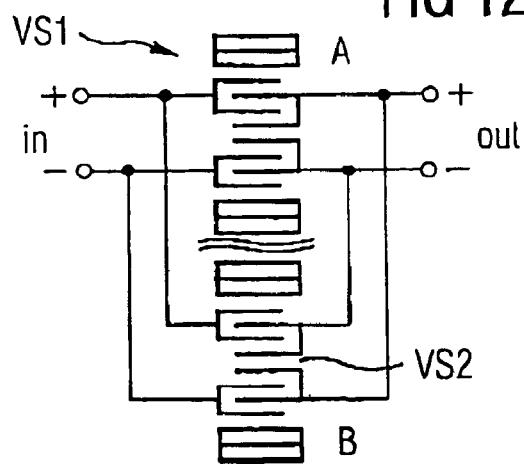
FIG. 12 shows a bridge circuit comprising two four-pole reactance elements.

FIG. 12 shows a further filter according to the invention, in which two four-pole reactance elements VS1, VS2 are connected crosswise to form a bridge. The resonators A and B of the two reactance elements are unbalanced relative to each other in terms of frequency, which can be adjusted by means of a different finger period or a different distance between the interdigital transducer and the reflectors of the resonators, for example.

Figure 13:
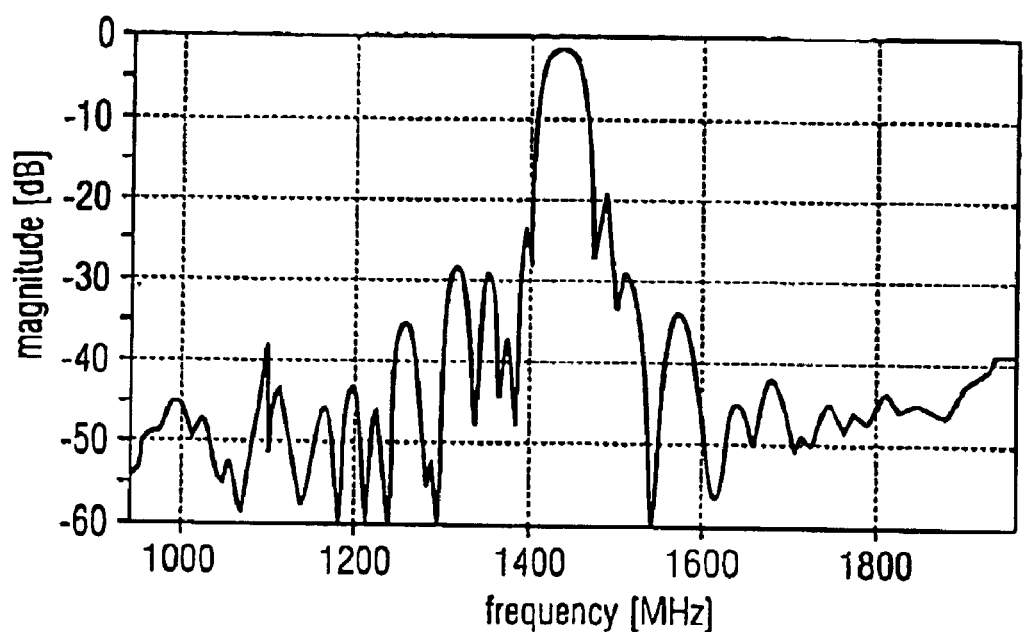
FIG. 13 shows a transmission curve of a filter according to the invention.

FIG. 13 shows a transmission curve of a filter according to the invention, which was determined using a filter embodied according to FIG. 7, for example. The filter demonstrates a high level of selection of more than 20 dB, and a low insertion attenuation of a maximum of 3 dB over the entire transmission range. Therefore, this filter is particularly well suited for use in mobile radio systems, since it meets the strict specifications required for this purpose. This also holds true for all of the other filters of the invention that are described in the exemplary embodiments.

Figure 14:
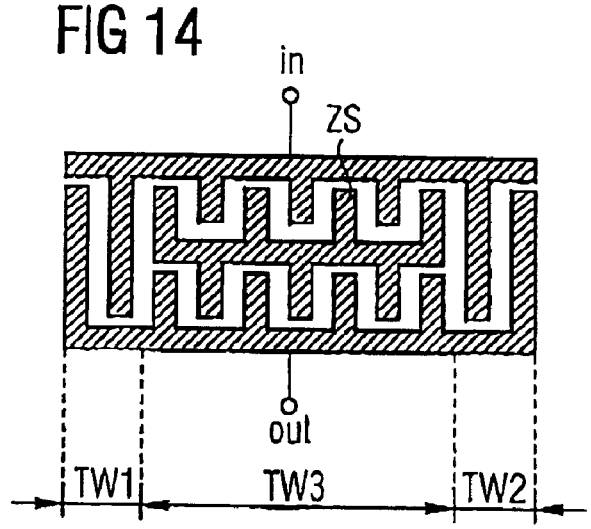
FIG. 14 shows an interdigital transducer, partly divided into half-tracks, for a reactance element having increased impedance.
Figure 15:
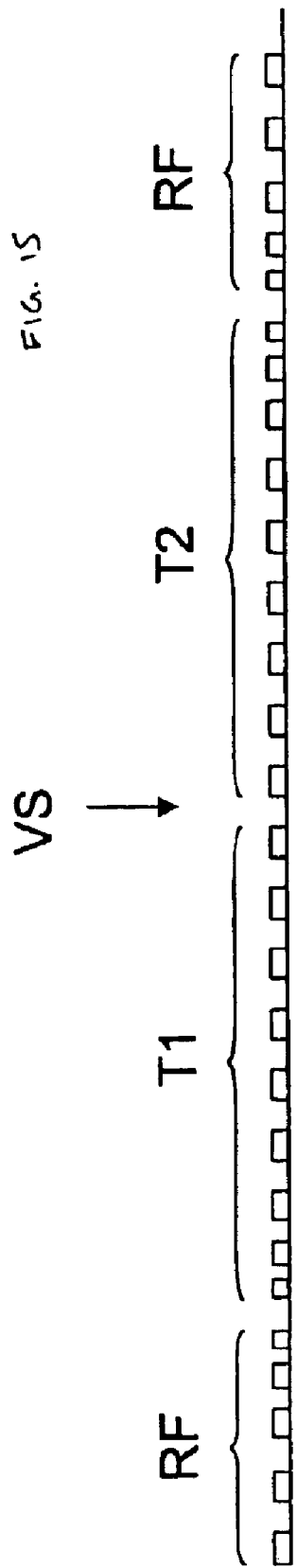
FIG. 15 shows a finger period of a filter having two interdigital transducers arranged between two reflectors.

FIG. 14 shows a cascade-weighted interdigital transducer that is known per se, and can be used in the reactance elements of filters according to the invention, or in DMS filter connected in cascade to form reactance elements; the transducer increases the impedance of the corresponding filter or reactance element. It has an additional center current bar ZS, at least in part, which divides the transducer into two partial transducers connected in series. The figure shows an interdigital transducer of this type, which can be divided into three partial transducers TW1, TW2, and TW3 connected in parallel with one another, with the center partial transducer TW3 in turn comprising two partial transducers connected in series via the additional current bar ZS. This interdigital transducer has an increased impedance as compared with a normal interdigital transducer. FIG. 15 shows a filter according to the invention that includes two interdigital transducers T1 and T2 arranged between two reflectors RF. The left reflector RF and the interdigital transducer T1 are two surface acoustic wave structures disposed adjacent to one another, which are phase-shifted relative to one another. The transition between the two phase-shifted surface acoustic wave structures can be formed by a continuously varied finger period and continuously varied finger distances, or only by a continuously varied finger period as illustrated in FIG. 15. The finger period exhibits a minimum in the region of the transition and decreases continuously inward from both sides. This avoids leakage losses in the HF filter.

Figure 16:
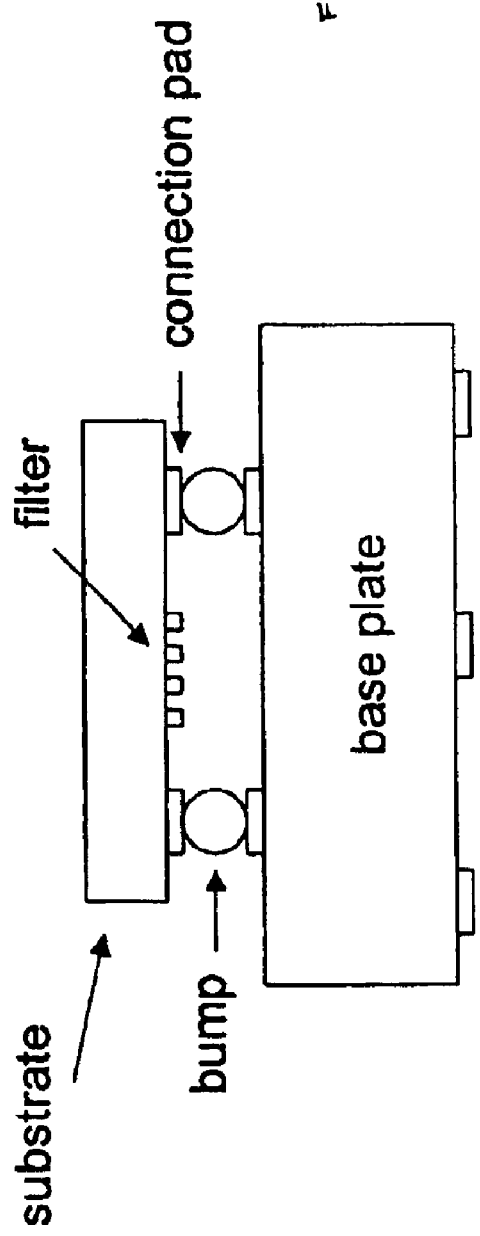
FIG. 16 shows a filter constructed on a substrate.

FIG. 16 shows a filter according to the invention that is constructed on a single substrate, with lithium tantalate and lithium niobate being the preferred materials. Electrode structures comprising aluminum, an aluminum/copper alloy, aluminum and copper layers, an aluminum/magnesium alloy, or aluminum and magnesium layers are suitable for the use as metal on these substrate materials. These materials are distinguished by good adhesion to the substrate material, for example. A SAW HF filter according to the invention is also highly geometrically symmetric, with the exception of the bridge circuit, when implemented on the piezoelectric substrate. Consequently, the electrical connectors (poles) are also arranged symmetrically on the substrate. If the filter according to the invention is mounted to a base plate using flip-chip technology, in which the substrate is connected to metal that faces the base plate by way of solder beads or bumps, this produces filters that have particularly compact external dimensions. The variations of the invention described in the exemplary embodiments represent only a few of the solutions that are possible by combining the individual elements described above, and which can be realized. This invention is therefore not limited to the structures shown, and ensues in a general form from claim 1.

What is claimed is:

1. A high frequency surface acoustic wave filter that is electrically symmetric, comprising:
    a piezoelectric substrate;
    an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, the four-connector reactance element being connected in series with a symmetric port of a symmetric dual mode surface acoustic wave filter, wherein the four-connector reactance element is connected in series with a symmetric port of at least one further symmetric dual mode surface acoustic wave filter.

2. The filter according to claim 1, wherein the piezoelectric substrate comprises at least one of lithium tantalate and lithium niobate.

3. The filter according to claim 1, wherein the four-connector reactance element includes metal that contains aluminum, aluminum and copper, or aluminum and magnesium.

4. The filter according to claim 1, wherein the input connectors and the output connectors are connected to contact pads on the substrate, the contact pads contacting a base plate.

5. The filter according to claim 1, further comprising one or more filter elements arranged electrically symmetric to the four-connector reactance element, wherein the one or more filter elements comprises one or more reactance elements.

6. The filter according to claim 1, further comprising one or more filter elements arranged electrically symmetric to the four-connector reactance element, wherein the one or more filter elements comprises one or more resonators.

7. A high frequency surface acoustic wave filter that is electrically symmetric, comprising:
    a piezoelectric substrate;
    an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, the four-connector reactance element being connected in series with a symmetric port of a symmetric dual mode surface acoustic wave filter, wherein the symmetric dual mode surface acoustic wave filter comprises an interdigital transducer divided into two adjacent partial transducers in series between the connectors of the symmetric port.

8. The filter according to claim 7, wherein the piezoelectric substrate comprises at least one of lithium tantalate and lithium niobate.

9. The filter according to claim 7, wherein the four-connector reactance element includes metal that contains aluminum, aluminum and copper, or aluminum and magnesium.

10. The filter according to claim 7, wherein the input connectors and the output connectors are connected to contact pads on the substrate, the contact pads contacting a base plate.

11. A high frequency surface acoustic wave filter that is electrically symmetric, comprising:
    a piezoelectric substrate; and
    an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, wherein at least one of the interdigital transducers in the four-connector reactance element is divided into partial transducers in a transverse direction, the partial transducers being connected in series.

12. A high frequency surface acoustic wave filter that is electrically symmetric, comprising:

a piezoelectric substrate;

an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, the four-connector reactance element being connected in series with a symmetric port of a symmetric dual mode surface acoustic wave filter, wherein at least one of the interdigital transducers in the four-connector reactance element is withdrawal-weighted or overlap-weighted.

13. A high frequency surface acoustic wave filter that is electrically symmetric, comprising:

a piezoelectric substrate; and an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, wherein at least one of the interdigital transducers in the four-connector reactance element is withdrawal-weighted or overlap-weighted.

14. A high frequency surface acoustic wave filter that is electrically symmetric, comprising:

a piezoelectric substrate; and an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, wherein the four-connector reactance element comprises two adjacent surface acoustic wave structures, the two adjacent surface acoustic wave structures comprising an interdigital transducer and a reflector, the two adjacent surface acoustic wave structures being phase-shifted relative to one another with a variable finger period having a minimum in a transition region and decreasing continuously inwardly from both sides towards the transition region.

15. A high frequency surface acoustic wave filter that is electrically symmetric, comprising:

a piezoelectric substrate;

an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, the four-connector reactance element being connected in series with a symmetric port of a symmetric dual mode surface acoustic wave filter wherein the four-connector reactance element comprises two adjacent surface acoustic wave structures, the two adjacent surface acoustic wave structures comprising an interdigital transducer and a reflector, the two adjacent surface acoustic wave structures being phase-shifted relative to one another with a variable finger period having a minimum in a transition region and decreasing continuously inwardly from both sides towards the transition region.

16. A high frequency surface acoustic wave filter that is electrically symmetric, comprising:

a piezoelectric substrate;

an acoustic track arranged on the piezoelectric substrate, the acoustic track operating using only two reflectors, the acoustic track comprising a four-connector reactance element arranged between the two reflectors, the four-connector reactance element having two interdigital transducers that are adjacent, the interdigital transducers being electrically isolated from one another and arranged in different signal paths, each interdigital transducer having a first bar representing an input connector of the four-connector reactance element and a second bar representing an output connector of the four-connector reactance element, the four-connector reactance element being connected in series with a symmetric port of a symmetric dual mode surface acoustic wave filter, wherein at least one of the interdigital transducers in the four-connector reactance element is divided into partial transducers in a transverse direction, the partial transducers being connected in series.

\* \* \* \* \*